(12) United States Patent
Park et al.

(10) Patent No.: US 9,653,525 B2
(45) Date of Patent: May 16, 2017

(54) LIGHT EMITTING DISPLAY DEVICE

(71) Applicant: SAMSUNG DISPLAY CO., LTD., Yongin, Gyeonggi-Do (KR)

(72) Inventors: Se Hun Park, Asan-si (KR); Yong Duck Son, Seongnam-si (KR); Jae Hwan Oh, Cheonan-si (KR); Ji Youn Lee, Seoul (KR); Young Jin Chang, Yongin-si (KR); Jae Beom Choi, Suwon-si (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 0 days.

(21) Appl. No.: 14/690,785

(22) Filed: Apr. 20, 2015

(65) Prior Publication Data

US 2016/0181332 A1 Jun. 23, 2016

(30) Foreign Application Priority Data

Dec. 22, 2014 (KR) .................. 10-2014-0185759

(51) Int. Cl.
*H01L 27/32* (2006.01)
*H01L 51/52* (2006.01)

(52) U.S. Cl.
CPC ...... *H01L 27/3246* (2013.01); *H01L 27/3267* (2013.01); *H01L 51/5271* (2013.01); *H01L 2251/5323* (2013.01)

(58) Field of Classification Search
CPC H01L 29/786; H01L 27/1214; H01L 27/3246
See application file for complete search history.

(56) References Cited

U.S. PATENT DOCUMENTS

2006/0145159 A1* 7/2006 Yokoyama .......... H01L 51/5218
257/72

FOREIGN PATENT DOCUMENTS

| KR | 10-2012-0042582 A | 5/2012 |
| KR | 10-2012-0061106 A | 6/2012 |
| KR | 10-2014-0024191 A | 2/2014 |
| KR | 10-2014-0036928 A | 3/2014 |

* cited by examiner

*Primary Examiner* — Tran Tran
(74) *Attorney, Agent, or Firm* — Lee & Morse, P.C.

(57) ABSTRACT

A light emitting display device includes a substrate, a first electrode, a pixel defining layer, a light emitting layer, a second electrode, and a reflective pattern. The substrate includes a plurality of pixels, each including a top emission pixel in a first area and a bottom emission pixel in a second area. The first electrode is in the first area and the second area. The pixel defining layer includes pixel openings to expose the first electrode and reflective pattern openings between adjacent pixels. The light emitting layer is on the first electrode, and the second electrode is on the light emitting layer. The reflective pattern is in the reflective pattern opening and spaced from the second electrode in the first area.

20 Claims, 9 Drawing Sheets

LIGHT EMITTING DISPLAY DEVICE

CROSS-REFERENCE TO RELATED APPLICATION

Korean Patent Application No. 10-2014-0185759, filed on Dec. 22, 2014, and entitled, "Light Emitting Display Device," is incorporated by reference herein in its entirety.

BACKGROUND

1. Field

One or more embodiments herein relate to a light emitting display device.

2. Description of the Related Art

A variety of flat panel displays have been developed. One example is an organic light emitting display. This type of display has a wide viewing angle, superior contrast, and high response speed.

An organic light emitting display device generates images using a plurality of self-emitting pixels. Each pixel has an organic light emitting layer between an anode and cathode. When voltages are applied to these electrodes, holes from the anode and electrons from the cathode combine in the organic light emitting layer to generate excitons. When the excitons change from state, light is emitted from the pixel.

Organic light emitting displays may be classified as a top emission type, a bottom emission type, and a double-side emission type. A double-side emission type display simultaneously implements top emission and bottom emission. As a result, luminance may be improved in such a display, and also different images may be simultaneously implemented.

SUMMARY

In accordance with one or more embodiments, a light emitting display device includes a substrate including a plurality of pixels, each pixel including a top emission pixel in a first area and a bottom emission pixel in a second area; a first electrode in the first area and the second area on the substrate; a pixel defining layer on the substrate and including pixel openings to expose the first electrode and reflective pattern openings between adjacent pixels; a light emitting layer on the first electrode; a second electrode on the light emitting layer; and a reflective pattern in the reflective pattern opening and spaced apart from the second electrode in the first area.

The reflective pattern may have a thickness that is substantially equal to a thickness of the second electrode in the second area, and the thickness of the second electrode in the second area may be greater than the thickness of the second electrode in the first area. The reflective pattern may include a same material as the second electrode in the second area, and the second electrode in the second area may include a conductive material. A thickness of the first electrode in the second area may be less than a thickness of the first electrode in the first area. The reflective pattern may be connected to or is spaced apart from the second electrode in the second area.

The display device may include a planarization layer between the substrate and the pixel defining layer, wherein the planarization layer includes a first bottom emission pixel opening that overlaps the opening of the pixel defining layer that exposes the first electrode in the second area, and a first reflective pattern opening that overlaps the reflective pattern opening.

The reflective pattern may be on inner side surfaces of the reflective pattern opening and the first reflective pattern opening, arranged to extend from the inner side surfaces of the reflective pattern opening and the first reflective pattern opening to bottom surfaces thereof, or arranged to extend from the inner side surfaces of the reflective pattern opening and the first reflective pattern opening to other surfaces thereof through the bottom surfaces.

The reflective pattern may be arranged on an inner side surface of the reflective pattern opening, arranged to extend from the inner side surface of the reflective pattern opening to a bottom surface thereof, or arranged to extend from the inner side surface of the reflective pattern opening to another surface thereof through the bottom surface. The reflective pattern may be divided or integrally formed between the pixels. The top emission pixels and the bottom emission pixels of the plurality of pixels may be alternately arranged.

In accordance with one or more other embodiments, a light emitting display device includes a substrate including a plurality of pixels, each pixel including a top emission pixel in a first area and a bottom emission pixel in a second area; a first electrode in the first area and the second area on the substrate; a pixel defining layer on the substrate and including pixel openings to expose the first electrode and reflective pattern openings between adjacent pixels; a light emitting layer on the first electrode; a second electrode on the light emitting layer; and a reflective pattern in the reflective pattern opening and having a thickness greater than a thickness of the second electrode in the first area.

The thickness of the reflective pattern may be substantially equal to the thickness of the second electrode in the second area. The reflective pattern may include a same material as the second electrode in the second area, and the second electrode in the second area may include a conductive material. A thickness of the first electrode in the second area may be less than a thickness of the first electrode in the first area. The reflective pattern may be connected to or is spaced apart from the second electrode in the second area.

The display device may include a planarization layer between the substrate and the pixel defining layer, wherein the planarization layer includes a first bottom emission pixel opening that overlaps the opening of the pixel defining layer that exposes the first electrode in the second area, and a first reflective pattern opening that overlaps the reflective pattern opening.

The reflective pattern may be on inner side surfaces of the reflective pattern opening and the first reflective pattern opening, arranged to extend from the inner side surfaces of the reflective pattern opening and the first reflective pattern opening to bottom surfaces thereof, or arranged to extend from the inner side surfaces of the reflective pattern opening and the first reflective pattern opening to other surfaces thereof through the bottom surfaces.

The reflective pattern may be arranged on an inner side surface of the reflective pattern opening, arranged to extend from the inner side surface of the reflective pattern opening to a bottom surface thereof, or arranged to extend from the inner side surface of the reflective pattern opening to another surface thereof through the bottom surface. The reflective pattern may be divided or integrally formed between the pixels. The top emission pixels and the bottom emission pixels of the plurality of pixels may be alternately arranged.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
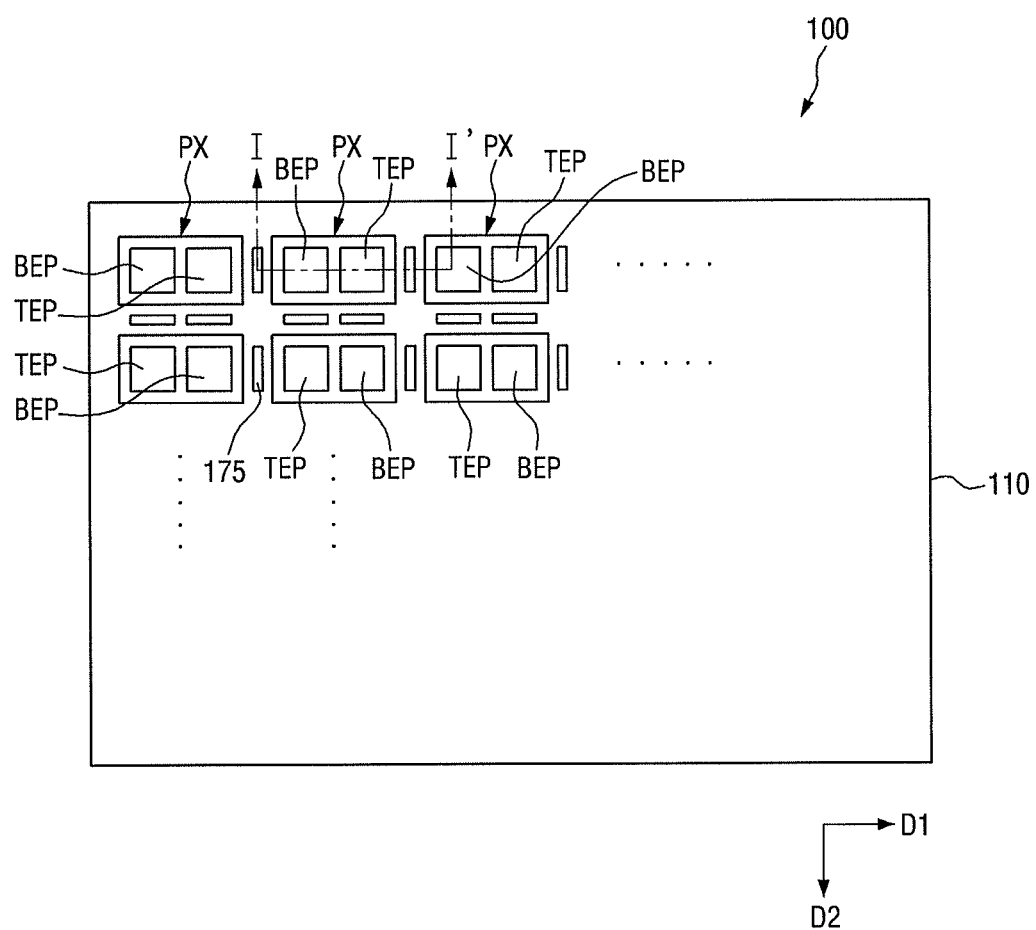
FIG. 1 illustrates an embodiment of a light emitting display.

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 2:
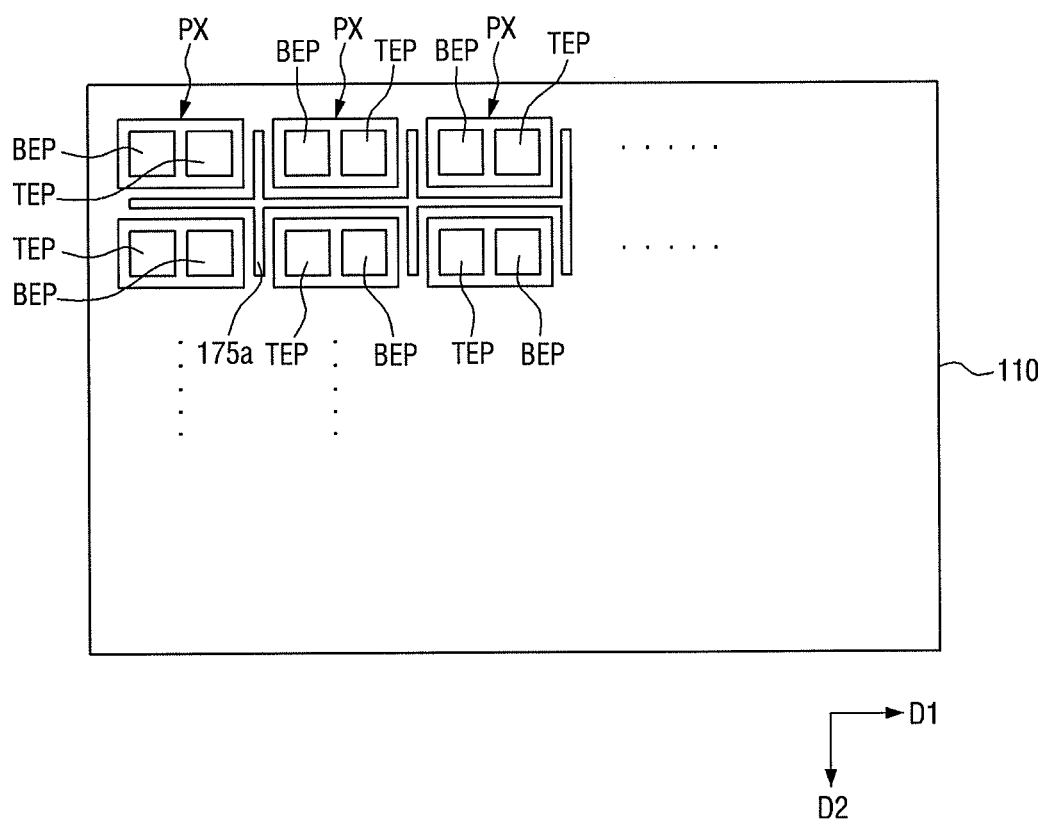
FIG. 2 illustrates another embodiment a light emitting display.

FIG. 1 illustrates an embodiment an embodiment of a light emitting display device 100 having a first reflective pattern, and FIG. 2 illustrates an embodiment of a light emitting display having a second reflective pattern. Referring to FIG. 1, the light emitting display device 100 includes a plurality of pixels PX, and a reflective pattern 175 arranged on a substrate 110.

Each pixel PX includes a top emission pixel TEP that emits light in a direction of a top surface of the substrate 110 (e.g., direction of a second electrode 170 in FIG. 3) and a bottom emission pixel BEP that emits light in a direction of a bottom surface of the substrate 110 (e.g., direction of a first electrode 140 in FIG. 3) The light emitting display device 100 is therefore double-side emission device.

The pixels PX are arranged so that the top emission pixels TEP and the bottom emission pixels BEP are alternately arranged in the pixel unit. For example, the top emission pixels TEP and the bottom emission pixels BEP may be alternately arranged in a first direction D1 and in a second direction D2 that crosses the first direction D1.

The pixels PX display images based on power from a power signal received from an external source, a gate signal received from a gate driving portion through a gate line, and a data signal received from a data driving portion through a data line.

The reflective pattern 175 has portions between adjacent pairs of pixels PX. In one case, the reflective pattern 175 reflects light from the top emission pixel TEP that is traveling in an unwanted direction. For example, the reflective pattern 175 reflects light between adjacent pixels PX that is travelling in the unwanted direction of a side surface of the substrate 110. The reflective pattern 175 reflects this light toward the top surface of the substrate 110. Additionally, or alternatively, the reflective pattern 175 reflects light from the bottom emission pixel BEP that is travelling in the unwanted direction of the side surface of the substrate 110. The reflective pattern 175 serves to reflect this light toward the bottom surface of the substrate 110. Accordingly, double-side emission may be performed in the light emitting display device 100 with improved light emission efficiency. Also, light leakage between the pixels PX may be reduced or prevented.

FIG. 1 illustrates that the reflective pattern 175 has separate (e.g., divided) portions formed between adjacent pairs of pixels PX. In contrast, FIG. 2 illustrates a reflective pattern 175a that is integrally (or continuously) formed between adjacent pairs of the pixels PX.

Figure 3:
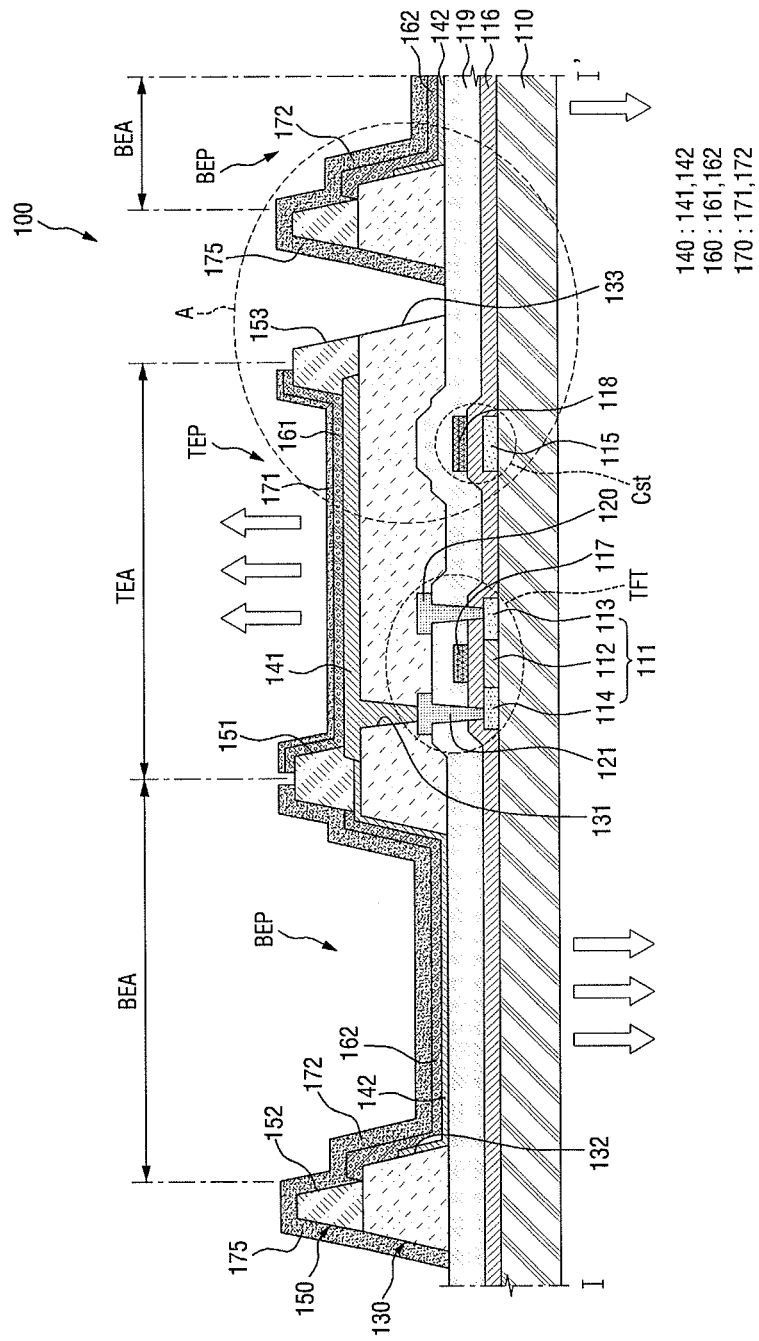
FIG. 3 illustrates a view along section line I-I' in FIG. 1.
Figure 4:
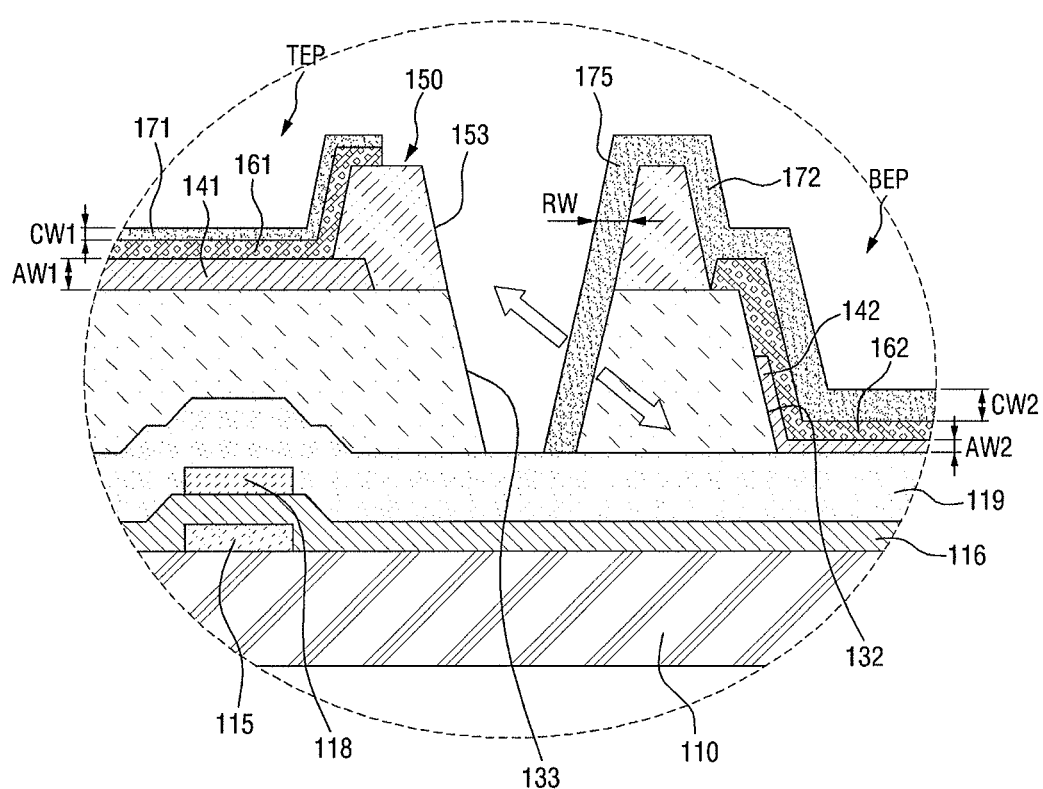
FIG. 4 illustrates an view of portion A in FIG. 3.

FIG. 3 illustrates a cross-sectional view of a portion of the light emitting display device 100 taken along line I-I' in FIG. 1. FIG. 4 illustrates an enlarged cross-sectional view of portion A in FIG. 3.

Referring to FIG. 3, the light emitting display device 100 includes a substrate 110, an active layer 111, a lower electrode 115, a gate insulating layer 116, a gate electrode 117, an upper electrode 118, an interlayer insulating layer 119, a source electrode 120, a drain electrode 121, a planarization layer 130, a first electrode 140, a pixel defining layer 150, a light emitting layer 160, a second electrode 170, and a reflective pattern 175.

The substrate 110 may be a transparent insulating substrate. The insulating substrate may include, for example, glass, quartz, or polymer resin. Examples of the polymer material include polyethersulphone (PES), polyacrylate (PA), polyarylate (PAR), polyetherimide (PEI), polyethylene napthalate (PEN), polyethylene terephalate (PET), polyphenylene sulfide (PPS), polyallylate, polyimide (PI), polycarbonate (PC), cellulose triacetate (CAT or TAC), cellulose acetate propionate (CAP), and a combination thereof. In one embodiment, the insulating substrate may be a flexible substrate, e.g., one made of a flexible material such as polyimide (PI).

The substrate 110 includes a plurality of pixels PX arranged in first and second directions D1 and D2. Each pixel PX includes a top emission pixel TEP arranged in a top emission area TEA (or a first area) and a bottom emission pixel BEP arranged in a bottom emission area BEA (or a second area).

The active layer 111 is arranged in the top emission area TEA and includes a channel area 112, a source area 113, and a drain area 114 positioned on respective sides of the channel area 112. The active layer 111 may include, for example, a silicon material, e.g., amorphous silicon or polysilicon. The source area 113 and the drain area 114 may be doped with p-type or n-type impurities. The active layer 111 may be formed, for example, using a photolithography method.

The lower electrode 115 is arranged in the top emission area TEA of the substrate 110 and is formed on the same layer as the active layer 120. The lower electrode 115 may be formed of the same material as the source area 113 or the drain area 114. For example, the lower electrode 115 may be formed of silicon and may include p-type or n-type impurities. The lower electrode 115 may be formed, for example, using a photolithography method.

The gate insulating layer 116 is formed on the substrate 110 to cover the active layer 111 and the lower electrode 115. The gate insulating layer 116 electrically insulates the gate electrode 117 from the active layer 111. The gate insulating layer 116 may be made of an insulating material, for example, silicon oxide (SiOx), silicon nitride (SiNx), or metal oxide. The gate insulating layer 116 may be formed, for example, using a deposition method.

The gate electrode 117 may be formed on the gate insulating layer 116. The gate electrode 117 may be formed in a position that overlaps the channel area 112 on an upper portion of the channel area 112, e.g., the gate insulating layer 116. The gate electrode 117 may include, for example, metal, alloys, metal nitride, conductive metal oxide, or transparent conductive materials. The gate electrode 117 may be formed, for example, using a photolithography method.

The upper electrode 118 may be formed on the same layer as the gate electrode 117 and may be formed of the same material as the gate electrode 117. The upper electrode 118 may be formed in a position that overlaps the lower electrode 115 on an upper portion of the lower electrode 115, e.g., the gate insulating layer 116. The upper electrode 118 forms a storage capacitor Cst with the lower electrode 115 and the gate insulating layer 116. A voltage applied to the gate electrode 117 of a thin film transistor TFT is charged in the storage capacitor Cst. The upper electrode 117 may be formed, for example, using a photolithography method.

The interlayer insulating layer 119 may be formed on the gate insulating layer 116 to cover the gate electrode 117 and the upper electrode 118. The interlayer insulating layer 119 may be made, for example, of silicon compounds. In one embodiment, the interlayer insulating layer 119 includes silicon oxide, silicon nitride, silicon oxynitride, silicon carbonitride, or silicon oxycarbonate. The interlayer insulating layer 119 may insulate the gate electrode 117 from the source electrode 120 and the drain electrode 121. The interlayer insulating layer 119 may be formed, for example, using a deposition method.

The source electrode 120 and the drain electrode 121 may be formed on the interlayer insulating layer 119. The source electrode 120 penetrates the interlayer insulating layer 119 and the gate insulating layer 116 to connect to the source area 113 of the active layer 111. The drain electrode 121 penetrates the interlayer insulating layer 119 and the gate insulating layer 116 to connect to the drain area 114.

The source electrode 120 and the drain electrode 121 may include, for example, metal, alloys metal nitride, conductive metal oxide, or transparent conductive materials. For example, the source electrode 120 and the drain electrode 121 may include aluminum, an aluminum-containing alloy, aluminum nitride, silver, a silver-containing alloy, tungsten, tungsten nitride, copper, a copper-containing alloy, nickel, chrome, chrome nitride, molybdenum, a molybdenum-containing alloy, titanium, titanium nitride, platinum, tantalum, tantalum nitride, neodymium, scandium, strontium ruthenium oxide, zinc oxide, indium tin oxide, tin oxide, indium oxide, gallium oxide, or indium zinc oxide. The source electrode 120 and the drain electrode 121 may be formed, for example, using a photolithography method.

The source electrode 120 and the drain electrode 121 form a thin film transistor TFT together with the active layer 111 and the gate electrode 117. The thin film transistor TFT may be a driving transistor which supplies current corresponding to a voltage applied to the gate electrode 117 to a light emitting diode (e.g., a portion including 141, 161, and 171 or a portion including 142, 162, and 172). The thin film transistor TFT may be connected to a switching transistor. The switching transistor applies a voltage that corresponds to a data signal from a data line to the thin film transistor TFT based on a gate signal from a gate line.

The planarization layer 130 may be formed on the interlayer insulating layer 119 to cover the source electrode 120 and the drain electrode 121. The planarization layer may be formed, for example, of an organic material. The planarization layer 130 may have a flat surface and may include a via-hole 131 in an area that overlaps the drain electrode 121 in the top emission area TEP to expose the drain electrode 121 upwardly.

Further, the planarization layer 130 may include a first bottom emission pixel opening 132 formed in the bottom emission area BEA to provide a space in which the light emitting layer 162 of the bottom emission pixel BEP is formed. The first bottom emission pixel opening 132 may expose part of an upper surface of the interlayer insulating layer 119.

Further, the planarization layer 130 may include a first reflective pattern opening 133 that provides a space between the top emission area TEA and the bottom emission area BEA. The reflective pattern 175 may be formed in this space. The first reflective pattern opening 133 may expose part of the upper surface of the interlayer insulating layer 119. The via-hole 131, the first bottom emission pixel opening 132, and the first reflective pattern opening 133 may have a tapered shaped, e.g., a width that narrows in a direction from an upper surface to a lower surface of the planarization layer 130. The planarization layer 130 may be formed, for example, using a photolithography method.

The first electrode 140 is arranged in the top emission area TEA and the bottom emission area BEA on the substrate 110. The first electrode arranged in the top emission area TEA is denoted by reference numeral 141. The first electrode arranged in the bottom emission area BEA is denoted by reference numeral 142.

In one embodiment, the first electrode 141 is formed on the planarization layer 130 and connected to the drain electrode 121. The first electrode 142 is formed on the interlayer insulating layer 119 that is exposed through the first bottom emission pixel opening 132, and is connected to the first electrode 141.

The first electrode 141 and the first electrode 142 may correspond to an anode electrode which receives a signal applied to the drain electrode 121, and provides holes to the light emitting layer 160 (161 and 162). In one embodiment, the first electrode 141 and the first electrode 142 correspond to a cathode electrode which receives a signal applied to the drain electrode 121, and provides electrons to the light emitting layer 160 (161 and 162). The first electrode 141 and the first electrode 142 may include one or more predetermined materials, e.g., metal, alloys, metal nitride, conductive metal oxide, or transparent conductive materials. For example, the first electrode 141 and the first electrode 142 may be made of aluminum, an aluminum-containing alloy, aluminum nitride, silver, a silver-containing alloy, tungsten, tungsten nitride, copper, a copper-containing alloy, nickel, chrome, chrome nitride, molybdenum, a molybdenum-containing alloy, titanium, titanium nitride, platinum, tantalum, tantalum nitride, neodymium, scandium, strontium ruthenium oxide, zinc oxide, indium tin oxide, tin oxide, indium oxide, gallium oxide, or indium zinc oxide.

In one embodiment, the first electrode 141 may have a multilayer structure, e.g., one in which indium tin oxide (ITO), silver (Ag), and indium tin oxide (ITO) are laminated. The first electrode 142 may have a multilayer structure, e.g., one in which indium tin oxide (ITO), silver (Ag), and indium tin oxide (ITO) are laminated. In another embodiment the first and/or second electrodes 141 and 142 may have a single layer structure, for example, made of indium tin oxide ITO.

In one embodiment, the first electrode 142 may have a thickness AW2 less than the thickness AW1 of the first electrode 141. In this case, the first electrode 141 may have a higher reflectivity than the reflectivity of the first electrode 142, and light from the top emission pixel TEP may be emitted in a direction of a top surface of the substrate 110 with high efficiency.

Further, the first electrode 142 may have a lower reflectivity than the first electrode 141, and light from the bottom emission pixel BEP may easily pass through the substrate 110 when the light travels in a direction of a bottom surface of the substrate 110. The first electrode 141 and the first electrode 1421 may be formed, for example, using a photolithography method.

The pixel defining layer 150 is formed on the substrate 110 (e.g., on the planarization layer 130) and is formed to expose the first electrode 140 (141 and 142). For example, the pixel defining layer 150 may include a first top emission pixel opening 151 formed in an area that overlaps the first electrode 141 in the top emission area TEA to expose the first electrode 141 upwardly. The first top emission pixel opening 151 may provide a space in which the light emitting layer 161 of the top emission pixel TEP is formed. Further, the pixel defining layer 150 may include a second top emission pixel opening 152 formed in an area that overlaps the first electrode 142 in the bottom emission area BEA to expose the first electrode 142 upwardly.

Further, the pixel defining layer 150 may include a second reflective pattern opening 153 formed in an area that overlaps the first reflective pattern opening 133 between adjacent pixels PX, in order to provide a space for the reflective pattern 175 together with the first reflective pattern opening 133. The first top emission pixel opening 151, the second bottom emission pixel opening 152, and the second reflective pattern opening 153 may have a tapered shape, e.g., one in which the width narrows in a direction from an upper surface to a lower surface of the pixel defining layer 150.

The pixel defining layer 150 may include, for example, at least one organic material. Examples include insulating materials, for example, benzo cyclo butane (BCB), polyimide (PI), poly amide (PA), acryl resin, and phenol resin. In another example, the pixel defining layer 150 may include an inorganic material such as silicon nitride. The pixel defining layer 150 may be formed, for example, using a photolithography process.

The light emitting layer 160 is formed on the first electrode 140 (141 and 142) that is exposed through the first top emission pixel opening 151 and the second bottom emission pixel opening 152 of the pixel defining layer 150. The light emitting layer arranged on the first electrode 141 of the top emission area TEA is denoted by reference numeral 161. The light emitting layer arranged on the first electrode 142 of the bottom emission area BEA is denoted by reference numeral 162.

The light emitting layer 160 (161 and 162) emits light based on a recombination of holes from the first electrode 140 (141 and 142) and electrons from the second electrode 170 (171 and 172). For example, when the holes and electrons are provided to the light emitting layer 160 (161 and 162), they recombine to form excitons. The light emitting layer 160 (161 and 162) then emits light as the excitons shift from an excited state to a ground state.

The light emitting layer 160 (161 and 162) may be or include one, some, or all of a red light emitting layer, a green light emitting layer, and a blue light emitting layer. The light emitting layer 160 (161 and 162) may include, for example, an inorganic material including Se or Zn, or a low-molecular or high-molecular organic material. The light emitting layer 160 (161 and 162) may be formed, for example, using a deposition method and a printing method. The arrows in FIG. 3 indicate examples of light emission directions.

The second electrode 170 may be formed on the light emitting layer 160 (161 and 162). The second electrode 170 may be a cathode that provides electrons to the light emitting layer 160 (161 and 162). In one embodiment, the second electrode 170 may be an anode that provides holes to the light emitting layer 160 (161 and 162). The light emitting layer arranged on the light emitting layer 161 of the top emission area TEA is denoted by reference numeral 171, and the light emitting layer arranged on the light emitting layer 162 of the bottom emission area BEA is denoted by reference numeral 172.

The second electrode 171 and the second electrode 172 include a conductive material, for example, Li, Ca, LiF/Ca, LiF/Al, Al, Mg, Ag, Pt, Pd, Ni, Au, Nd, Ir, Cr, BaF, Ba, a compound thereof, or a mixture thereof (e.g., a mixture of Ag and Mg). The second electrode 171 and the second electrode 172 may further include an auxiliary electrode. The auxiliary electrode may include a layer on which the above-described material is deposited and formed, and transparent metal oxide, for example, indium-tin-oxide (ITO), indium-zinc-oxide (IZO), zinc oxide (ZnO), or indium-tin-zinc-oxide (ITZO), formed on the layer.

In one embodiment, the second electrode 171 may include, for example, MgAg or Al and the second electrode 172 may include Al. The second electrode 171 and the second electrode 172 are spaced apart from each other and have different thicknesses. For example, the second electrode 172 may have a thickness CW2 that is greater than the thickness CW1 of the second electrode 171. In this case, the second electrode 171 may have a lower reflectivity than the reflectivity of the second electrode 172, and may make light emitted from the top emission pixel TEP easily pass through the second electrode 171 when the light travels in the direction of the top surface of substrate 110.

The second electrode 172 may have reflectivity that is greater than the reflectivity of the second electrode 171, and may make light generated from the bottom emission pixel BEP to be emitted in the direction of the bottom surface of the substrate 110 with high efficiency. The second electrode 171 and the second electrode 172 may be formed, for example, using a deposition method. For example, the second electrode 171 and the second electrode 172 may be formed using a halftone mask in the deposition method. In this case, a process of forming the second electrode 171 and the second electrode 172 may be simplified.

The reflective pattern 175 is spaced apart from the second electrode 171 of the top emission area TEA between the adjacent pixels PX. For example, the reflective pattern 175 may be formed on inner side surfaces of the first reflective pattern opening 133 of the planarization layer 130 and the second reflective pattern opening 153 of the pixel defining layer 150 between the adjacent pixels PX. The reflective pattern 175 may be connected to the second electrode 172, may be formed of the same material as the material of the second electrode 172, and may have the same thickness RW as the thickness of the second electrode 172. For example, the reflective pattern 175 may be formed when the second electrode 172 is formed.

The reflective pattern 175 may have high reflectivity which is the same or similar to the second electrode 172, and may reflect light from an unwanted direction to a desired direction. For example, light generated from the top emission pixel TEP between the adjacent pixels PX may travel in the unwanted direction of the side surface of the substrate 110. The reflective pattern may reflect this light to travel in the desired direction of the top surface of the substrate 110. Additionally, or alternatively, light generated from the bottom emission pixel BEP may travel in the unwanted direction of the side surface of the substrate 110. The reflective pattern may reflect this light to travel in the desired direction of the bottom surface of the substrate 110. Accordingly, double-side emission of the light emitting display device 100 may be performed with increased light emission efficiency. Also, light leakage between the pixels PX may be reduced or prevented. The arrows in FIG. 4 indicate examples of the light reflected by the reflective pattern 175.

In one embodiment, the light emitting display device 100 may include an encapsulation substrate arranged on the second electrode 170 (171 and 172) and an upper portion of the reflective pattern 175. The encapsulation substrate may be or include, for example, an insulating substrate. A spacer may be arranged between the second electrode 170 (171 and 172) and the reflective pattern 175 on the pixel defining layer 150 and the encapsulation substrate. In one embodiment, the encapsulation substrate may be omitted. In this case, an encapsulation layer that includes an insulating material may cover the whole structure to protect the structure.

Thus, as described above, the reflective pattern 175 may redirect light from an unwanted direction to a desired direction in order to increase light emitting efficiency and/or to reduce or prevent light leakages from the pixels in an organic light emitting display device which performs double-sided light emission.

Figure 5:
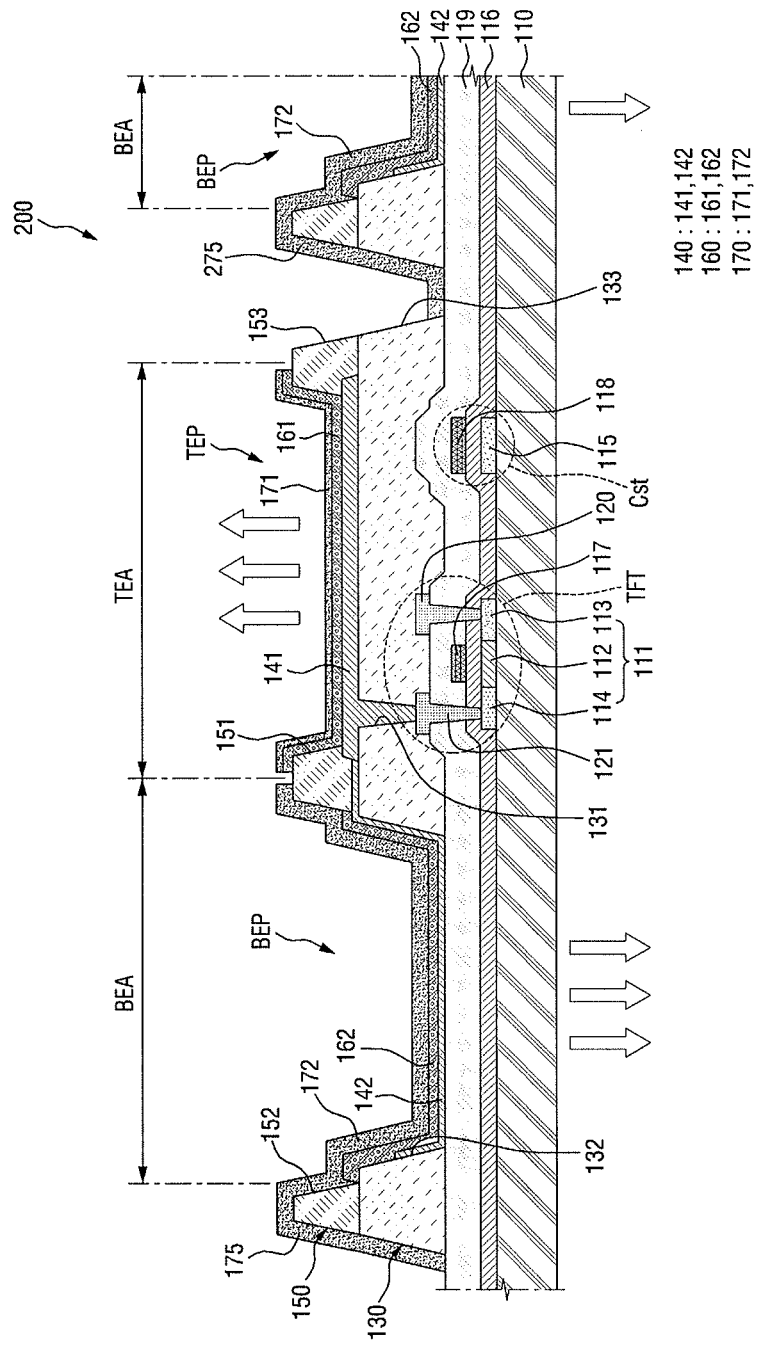
FIG. 5 illustrates another embodiment of a cross-sectional view of the display.

FIG. 5 illustrates a cross-sectional view of a portion that corresponds to FIG. 3 in another embodiment of a light emitting display device 200. This device 200 may have the same configuration as the light emitting display device 100 in FIG. 3, except for a reflective pattern 275 that is different from the reflective pattern 175 in FIG. 3.

Referring to FIG. 5, the light emitting display device 200 includes a substrate 110, an active layer 111, a lower electrode 115, a gate insulating layer 116, a gate electrode 117, an upper electrode 118, an interlayer insulating layer 119, a source electrode 120, a drain electrode 121, a planarization layer 130, a first electrode 140, a pixel defining layer 150, a light emitting layer 160, a second electrode 170, and a reflective pattern 275. The arrows in FIG. 5 indicate an example of directions in which light is emitted.

The reflective pattern 275 is similar in some ways to the reflective pattern 175 of FIG. 3. However, the reflective pattern 275 is formed to extend from inner side surfaces to bottom surfaces of the first reflective pattern opening 133 of the planarization layer 130 and the second reflective pattern opening 153 of the pixel defining layer 150 between the adjacent pixels PX. The reflective pattern 275 may be connected to the second electrode 172.

The reflective pattern 275 may reflect light from an unwanted direction to a desired direction. For example, light generated from the top emission pixel TEP between the adjacent pixels PX may travel in the unwanted direction of the side surface of the substrate 110. The reflective pattern 275 may reflect this light to travel in the direction of the top surface of the substrate 110. Additionally, or alternatively, light generated from the bottom emission pixel BEP may travel in the unwanted direction of the side surface of the substrate 110. The reflective pattern 275 may reflect this light to travel in the desired direction of the bottom surface of the substrate 110. The reflective pattern 275 may therefore reflect light generated from the top emission pixel TEP and travelling in the unwanted direction of the side surface of the substrate 110.

The reflective pattern 275 may have high reflectivity and is formed between the adjacent pixels PX, extending from the inner side surfaces to the bottom surfaces of the first reflective pattern opening 133 of the planarization layer 130 and the second reflective pattern opening 153 of the pixel defining layer 150. In this manner, the reflective pattern 275 may reflect the light from an unwanted direction to a desired direction, to thereby improve light emission efficiency during double-side emission and reduce or prevent light leakage between the pixels PX.

Figure 6:
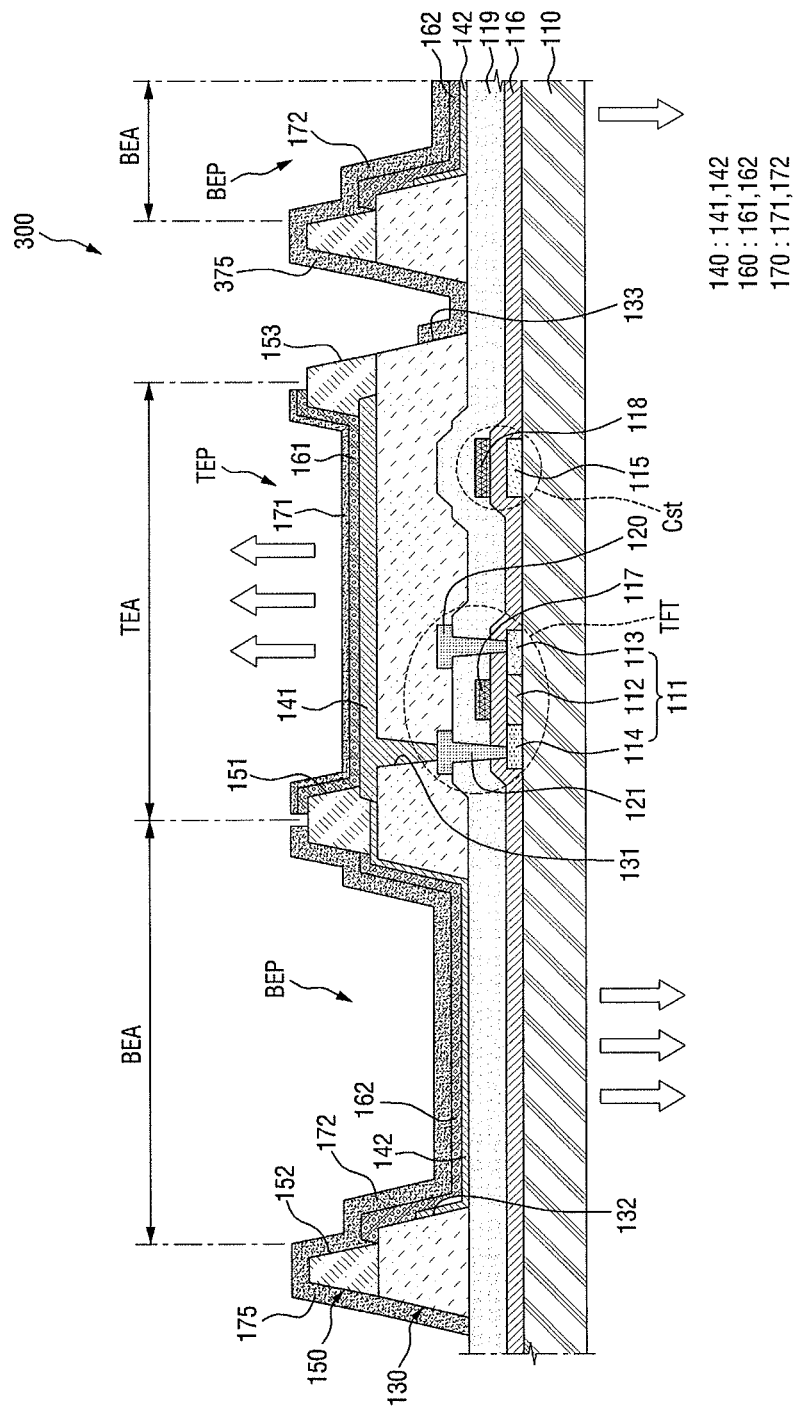
FIG. 6 illustrates another embodiment of a cross-sectional view of the display.

FIG. 6 illustrates a cross-sectional view of a portion that corresponds to FIG. 3 in another embodiment of a light emitting display device 300. The device 300 may be the same or similar to the light emitting display device 100 in FIG. 3, except for a reflective pattern 375 that is different from the reflective pattern 175 in FIG. 3.

Referring to FIG. 6, the light emitting display device 300 includes a substrate 110, an active layer 111, a lower electrode 115, a gate insulating layer 116, a gate electrode 117, an upper electrode 118, an interlayer insulating layer 119, a source electrode 120, a drain electrode 121, a planarization layer 130, a first electrode 140, a pixel defining layer 150, a light emitting layer 160, a second electrode 170, and a reflective pattern 375. The arrows in FIG. 6 indicate examples of directions in which light is emitted.

The reflective pattern 375 is similar in some ways to the reflective pattern 175 of FIG. 3. However, the reflective pattern 375 is formed to extend from inner side surfaces to the other side surfaces through bottom surfaces of the first reflective pattern opening 133 of the planarization layer 130 and the second reflective pattern opening 153 of the pixel defining layer 150 between the adjacent pixels PX. The reflective pattern 375 may be connected to the second electrode 172.

The reflective pattern 375 may reflect light from an unwanted direction to a desired direction. For example, light generated from the top emission pixel TEP between the adjacent pixels PX may travel in the unwanted direction of the side surface of the substrate 110. The reflective pattern 375 may reflect the light to travel in the desired direction of the top surface of the substrate 110. Additionally, or alternatively, light generated from the bottom emission pixel BEP may travel in the unwanted direction of the side surface of the substrate 110. The reflective pattern 375 reflects the light to travel in the desired direction of the bottom surface of the substrate 110. The reflective pattern 375 may therefore reflect light generated from the top emission pixel TEP and travelling in the unwanted direction of the side surface of the substrate 110.

The reflective pattern 375 may have high reflectivity and is formed between the adjacent pixels PX, extending from the inner side surfaces to the other side surfaces through the bottom surfaces of the first reflective pattern opening 133 of the planarization layer 130 and the second reflective pattern opening 153 of the pixel defining layer 150. Thus, the reflective pattern 375 reflects light from an unwanted direction to a desired direction, to thereby increase light emission efficiency during double-side emission and reduce or prevent the light leakage between the pixels PX.

Figure 7:
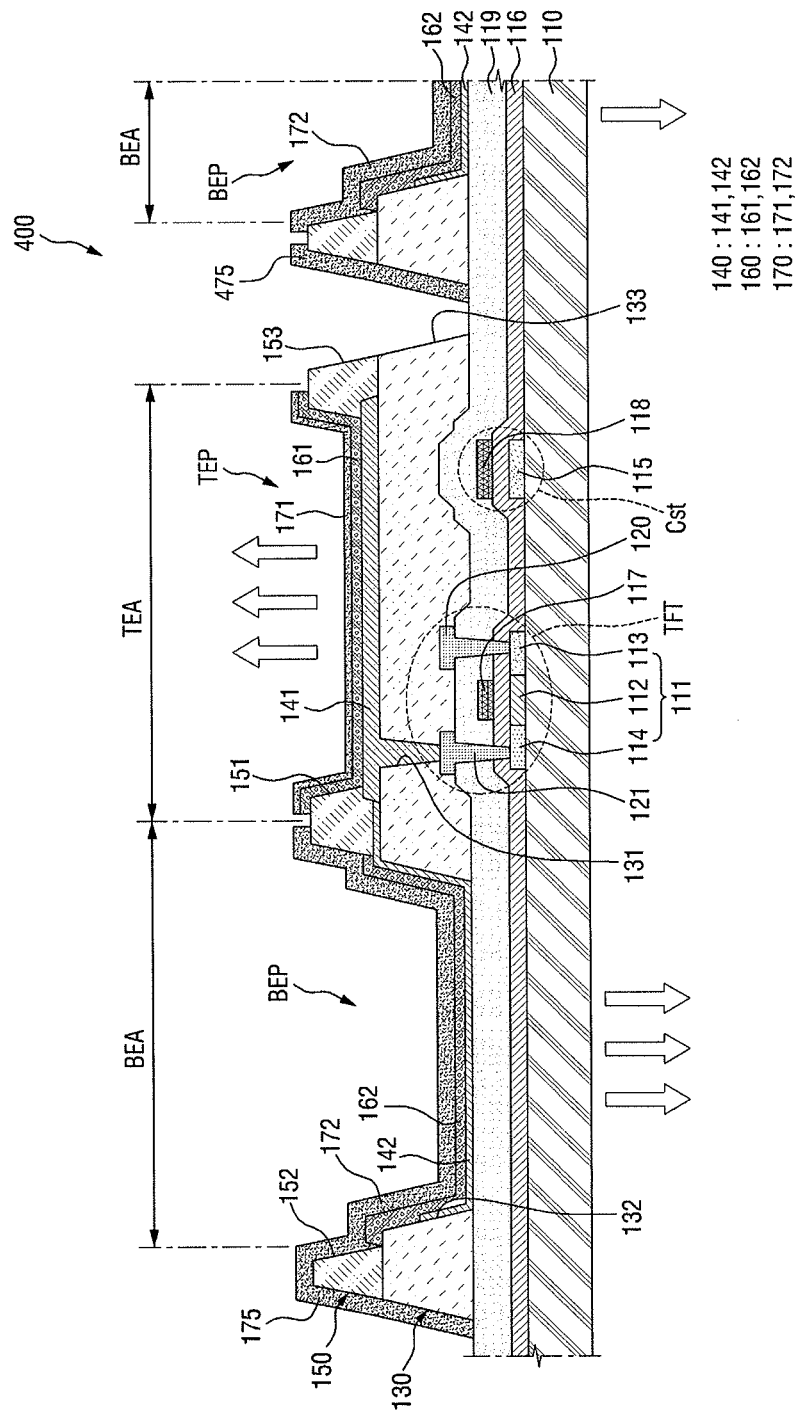
FIG. 7 illustrates another embodiment of a cross-sectional view of the display.

FIG. 7 illustrates a cross-sectional view of a portion that corresponds to FIG. 3 in another embodiment of a light emitting display device 400. The device 400 may be the same as or similar to the light emitting display device 100 in FIG. 3, except for a reflective pattern 475 that is different from the reflective pattern 175 in FIG. 3.

Referring to FIG. 7, the light emitting display device 400 includes a substrate 110, an active layer 111, a lower electrode 115, a gate insulating layer 116, a gate electrode 117, an upper electrode 118, an interlayer insulating layer 119, a source electrode 120, a drain electrode 121, a planarization layer 130, a first electrode 140, a pixel defining layer 150, a light emitting layer 160, a second electrode 170, and a reflective pattern 475. The arrows in FIG. 7 indicate examples of directions in which light is emitted.

The reflective pattern 475 is similar in some ways to the reflective pattern 175 of FIG. 3. However, the reflective pattern 475 is spaced apart and thus electrically insulated from the second electrode 172.

The reflective pattern 475 reflects light from an unwanted direction to a desired direction. For example, light generated from the top emission pixel TEP between the adjacent pixels PX may travel in the unwanted direction of the side surface of the substrate 110. The reflective pattern 475 reflects the light to travel in the desired direction of the top surface of the substrate 110. Additionally, or alternatively, light generated from the bottom emission pixel BEP may travel in the unwanted direction of the side surface of the substrate 110. The reflective pattern 475 reflects the light to travel in the desired direction of the bottom surface of the substrate 110. The reflective pattern 475 may therefore become conductive to reduce or prevent parasitic capacitance.

The reflective pattern 475 may have high reflectivity and may be spaced apart and thus electrically insulated from the second electrode 172. The reflective pattern 475 may reduce or prevent parasitic capacitance between the reflective pattern 475 and other features, and may reflect light from an unwanted direction to a desired direction. As a result, light emission efficiency during double side emission may be increased and light leakage between the pixels PX may be reduced or prevented.

Figure 8:
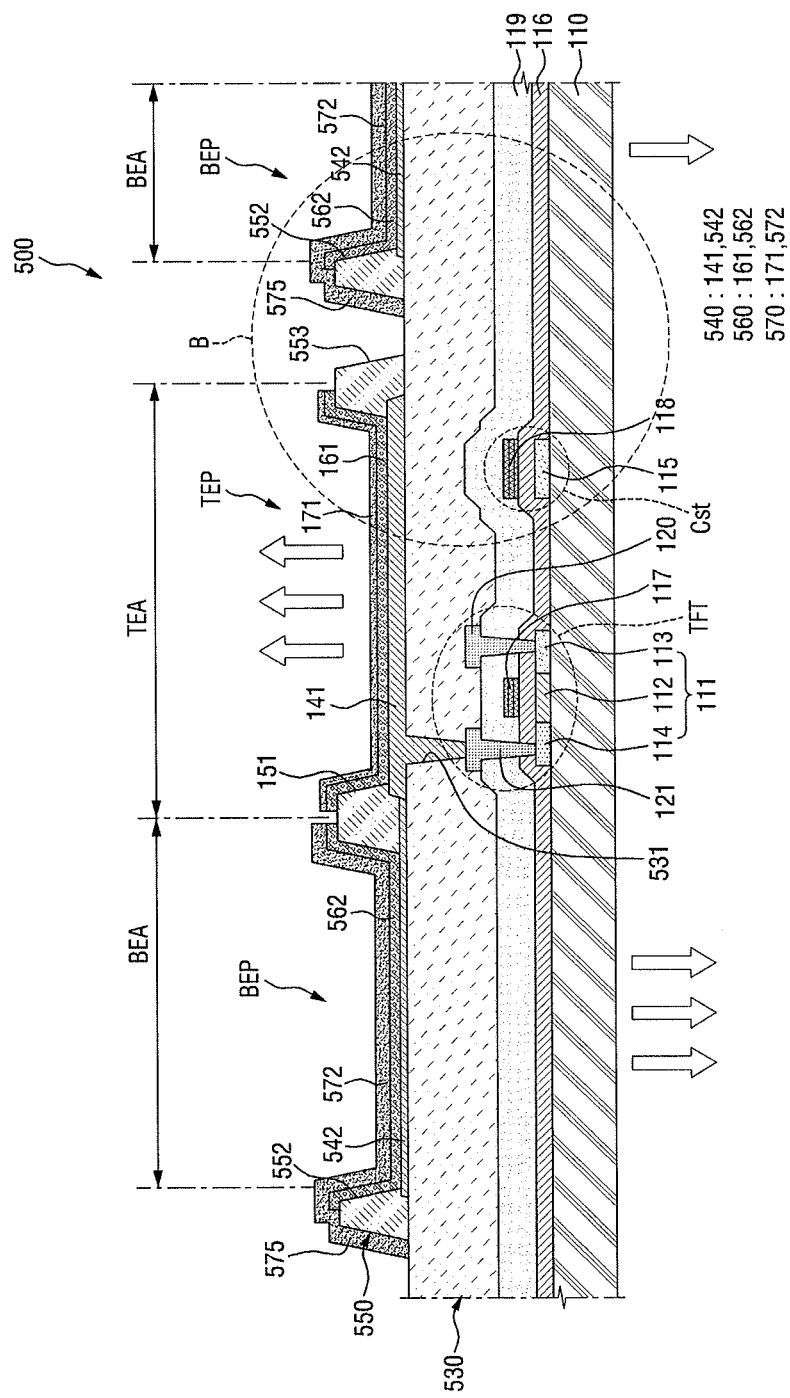
FIG. 8 illustrates another embodiment of a cross-sectional view of the display.
Figure 9:
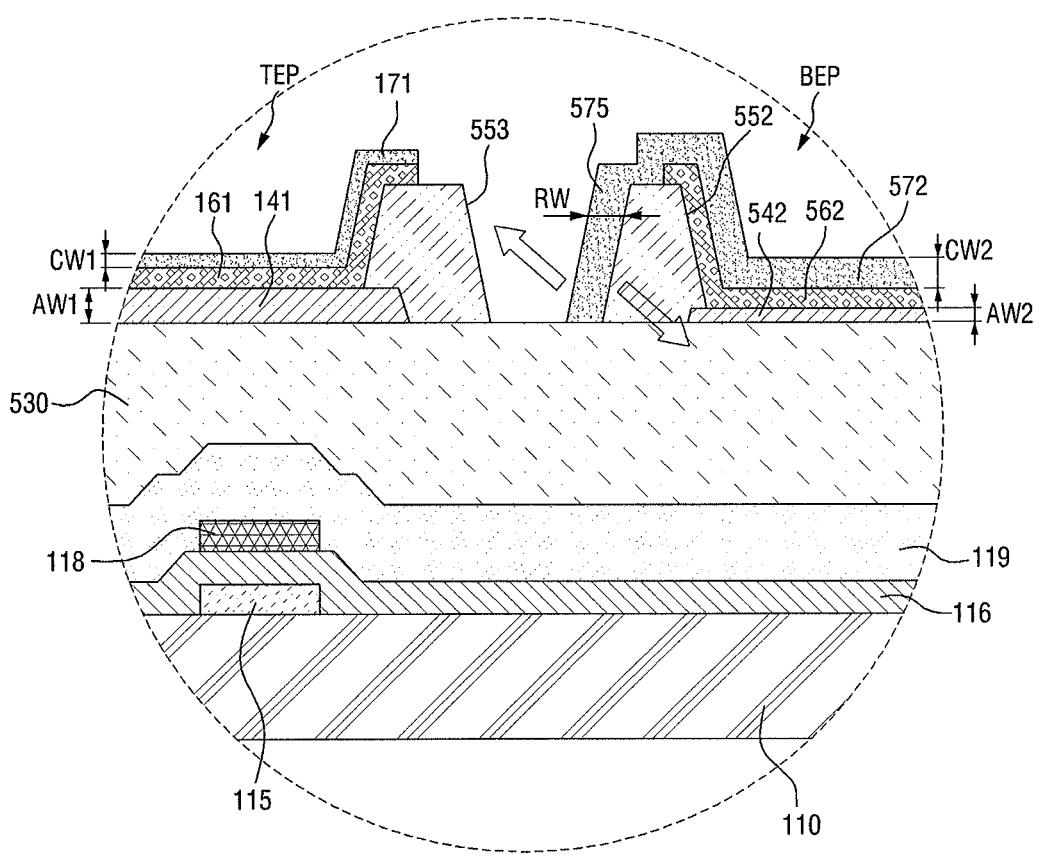
FIG. 9 illustrates an enlarged view of an embodiment of portion B in FIG. 8.

FIG. 8 illustrates a cross-sectional view of a portion that corresponds to FIG. 3 in another embodiment of a light emitting display device 500. FIG. 9 is an enlarged cross-sectional view of portion B of FIG. 8 according to one embodiment.

Referring to FIG. 8, the light emitting display device 500 includes a substrate 110, an active layer 111, a lower electrode 115, a gate insulating layer 116, a gate electrode 117, an upper electrode 118, an interlayer insulating layer 119, a source electrode 120, a drain electrode 121, a planarization layer 530, a first electrode 540, a pixel defining layer 550, a light emitting layer 560, a second electrode 570, and a reflective pattern 575.

The substrate 110, the active layer 111, the lower electrode 115, the gate insulating layer 116, the gate electrode 117, the upper electrode 118, the interlayer insulating layer 119, the source electrode 120, and the drain electrode 121 may be the same as in one or more of the aforementioned embodiments.

The planarization layer 530 is similar in some ways to the planarization layer 130 of FIG. 3. However, the planarization layer 530 includes only a via-hole 531 which is formed in an area that overlaps the drain electrode 121 in the top emission area TEA to expose the drain electrode 121 upwardly.

The first electrode 540 is similar in some ways to the first electrode 140 of FIG. 3. However, the first electrode 542, that is arranged in the bottom emission area BEA, may be formed on the planarization layer 530 like the first electrode 141 that is arranged in the top emission area TEA. For example, a flat portion of the first electrode 542 may be arranged on the same layer as the layer of the flat portion of the first electrode 141.

The pixel defining layer 550 is the same in some ways as the pixel defining layer 150 of FIG. 3. However, the pixel defining layer 550 is formed on the planarization layer 230 to directly expose the first electrode 540 (141 and 542). For example, the pixel defining layer 550 may include a first top emission pixel opening 151, that is formed in an area that overlaps the first electrode 141 in the top emission area TEA, to expose the first electrode 141 upwardly. Further, the pixel defining layer 550 may include a first bottom emission pixel opening 552, that is formed in an area that overlaps the first electrode 542 in the bottom emission area BEA, to expose the first electrode 542 upwardly. The first bottom emission pixel opening 552 may provide a space in which a light emitting layer 562 of the bottom emission pixel BEP is formed.

Further, the pixel defining layer 550 may include a first reflective pattern opening 553 formed between the adjacent pixels PX, in order to provide a space for the reflective pattern 575. The first top emission pixel opening 151, the first bottom emission pixel opening 552, and the first reflective pattern opening 553 may have a tapered shape, e.g., one having a width that narrows from an upper surface to a lower surface of the pixel defining layer 550.

The light emitting layer 560 is similar in some ways to the light emitting layer 160 of FIG. 3. However, a light emitting layer 562 arranged in the bottom emission area BEA may be formed on the planarization layer 530 like the light emitting layer 161 that is arranged in the top emission area TEA. For example, a flat portion of the light emitting layer 562 may be arranged on the same layer as the layer of the flat portion of the light emitting layer 161. The arrows in FIG. 8 indicate examples of directions in which light is emitted.

The second electrode 570 is similar in some ways to the second electrode 170 of FIG. 3. However, a second electrode 572 arranged in the bottom emission area BEA may be formed on the planarization layer 530 like the second electrode 171 that is arranged on the top emission area TEA. For example, a flat portion of the second electrode 572 may be arranged on the same layer as the layer of the flat portion of first electrode 171.

The reflective pattern 575 is similar in some ways to the reflective pattern 175 of FIG. 3. However, the reflective pattern 575 may be formed on an inner side surface of the first reflective pattern opening 553 of the pixel defining layer 550 between the adjacent pixels PX. The arrows in FIG. 9 indicate examples of the directions in which light is reflected by the reflective pattern 575.

The reflective pattern 575 may have high reflectivity, and reflects light from an unwanted direction to a desired direction. As a result, light emission efficiency during double side emission may increase and light leakage between the pixels PX may be reduced or prevented.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the present invention as set forth in the following claims.

What is claimed is:

1. A light emitting display device, comprising:
   a substrate including a plurality of pixel areas, each of the pixel areas including a first area and a second area;
   a first electrode in the first area and the second area on the substrate;
   a pixel defining layer on the substrate and including pixel openings to expose the first electrode and a reflective pattern opening between adjacent pixel areas, the reflective pattern opening not overlapping the pixel openings;
   a light emitting layer on the first electrode;
   a second electrode on the light emitting layer; and
   a reflective pattern in the reflective pattern opening and spaced apart from the second electrode in the first area, wherein the reflective pattern does not contact the first electrode of the first area and the first electrode of the second area.

2. The display device as claimed in claim 1, wherein:
   the reflective pattern has a thickness that is substantially equal to a thickness of the second electrode in the second area, and
   the thickness of the second electrode in the second area is greater than the thickness of the second electrode in the first area.

3. The display device as claimed in claim 1, wherein:
   the reflective pattern includes a same material as the second electrode in the second area, and
   the second electrode in the second area includes a conductive material.

4. The display device as claimed in claim 1, wherein a thickness of the first electrode in the second area is less than a thickness of the first electrode in the first area.

5. The display device as claimed in claim 1, wherein the reflective pattern is connected to or is spaced apart from the second electrode in the second area.

6. The display device as claimed in claim 1, further comprising:
   a planarization layer between the substrate and the pixel defining layer,
   wherein the planarization layer includes a first bottom emission pixel opening that overlaps the opening of the pixel defining layer that exposes the first electrode in the second area, and a first reflective pattern opening that overlaps the reflective pattern opening.

7. The display device as claimed in claim 6, wherein the reflective pattern:
   is on inner side surfaces of the reflective pattern opening and the first reflective pattern opening,
   extends from the inner side surfaces of the reflective pattern opening and the first reflective pattern opening to bottom surfaces thereof, or
   extends from the inner side surfaces of the reflective pattern opening and the first reflective pattern opening to other surfaces thereof through the bottom surfaces.

8. The display device as claimed in claim 1, wherein the reflective pattern:
   is on an inner side surface of the reflective pattern opening,
   extends from the inner side surface of the reflective pattern opening to a bottom surface thereof, or
   extends from the inner side surface of the reflective pattern opening to another surface thereof through the bottom surface.

9. The display device as claimed in claim 1, wherein the reflective pattern is divided or integrally formed between the pixel areas.

10. The display device as claimed in claim 1, wherein the first area of the pixel areas and the second area of the pixel areas are alternately arranged.

11. A light emitting display device, comprising:
    a substrate including a plurality of pixel areas, each of the pixel areas including a first area and a second area;
    a first electrode in the first area and the second area on the substrate;
    a pixel defining layer on the substrate and including pixel openings to expose the first electrode and a reflective pattern opening between adjacent pixel areas, the reflective pattern opening not overlapping the pixel openings;
    a light emitting layer on the first electrode;
    a second electrode on the light emitting layer; and
    a reflective pattern in the reflective pattern opening and having a thickness greater than a thickness of the second electrode in the first area, wherein the reflective pattern does not contact the first electrode of the first area and the first electrode of the second area.

12. The display device as claimed in claim 11, wherein the thickness of the reflective pattern is substantially equal to the thickness of the second electrode in the second area.

13. The display device as claimed in claim 11, wherein:
    the reflective pattern includes a same material as the second electrode in the second area, and the second electrode in the second area includes a conductive material.

14. The display device as claimed in claim 11, wherein a thickness of the first electrode in the second area is less than a thickness of the first electrode in the first area.

15. The display device as claimed in claim 11, wherein the reflective pattern is connected to or is spaced apart from the second electrode in the second area.

16. The display device as claimed in claim 11, further comprising:
    a planarization layer between the substrate and the pixel defining layer,
    wherein the planarization layer includes a first bottom emission pixel opening that overlaps the opening of the pixel defining layer that exposes the first electrode in the second area, and a first reflective pattern opening that overlaps the reflective pattern opening.

17. The display device as claimed in claim 16, wherein the reflective pattern:
    is on inner side surfaces of the reflective pattern opening and the first reflective pattern opening,
    extends from the inner side surfaces of the reflective pattern opening and the first reflective pattern opening to bottom surfaces thereof, or
    extends from the inner side surfaces of the reflective pattern opening and the first reflective pattern opening to other surfaces thereof through the bottom surfaces.

18. The display device as claimed in claim 11, wherein the reflective pattern:
    is on an inner side surface of the reflective pattern opening,
    extends from the inner side surface of the reflective pattern opening to a bottom surface thereof, or
    extends from the inner side surface of the reflective pattern opening to another surface thereof through the bottom surface.

19. The display device as claimed in claim 11, wherein the reflective pattern is divided or integrally formed between the pixel areas.

20. The display device as claimed in claim 11, wherein the first area of the pixel areas and the second area of the pixels areas are alternately arranged.

* * * * *